United States Patent [19]

Nagata

[11] Patent Number: 4,736,168
[45] Date of Patent: Apr. 5, 1988

[54] DIELECTRIC RESONATOR CONTROLLED OSCILLATOR HAVING A RAISED FREQUENCY MULTIPLYING EFFICIENCY

[75] Inventor: Eiji Nagata, Tokyo, Japan
[73] Assignee: NEC Corporation, Tokyo, Japan
[21] Appl. No.: 43,286
[22] PCT Filed: Jul. 23, 1986
[86] PCT No.: PCT/JP86/00390
§ 371 Date: Mar. 18, 1987
§ 102(e) Date: Mar. 18, 1987
[87] PCT Pub. No.: WO87/00707
PCT Pub. Date: Jan. 29, 1987

[30] Foreign Application Priority Data
Jul. 23, 1985 [JP] Japan .................. 60-161160

[51] Int. Cl.[4] .............................. H03B 5/18
[52] U.S. Cl. ..................... 331/96; 331/117 D; 331/117 FE
[58] Field of Search ........ 331/96, 99, 107 R, 107 DP, 331/107 SL, 117 R, 117 D, 117 FE

[56] References Cited
U.S. PATENT DOCUMENTS
4,149,127  4/1979  Murakami et al. ......... 331/117 D X
4,673,895  6/1987  Tadachi et al. .......... 331/117 FE X FOREIGN PATENT DOCUMENTS
0048189  3/1982  European Pat. Off. .
0090414  10/1983  European Pat. Off. .
2803846  9/1978  Fed. Rep. of Germany .

OTHER PUBLICATIONS
Helsinki, Tlooto Mizumura et al, "20 GHz GaAs FET Oscillator Using a Dielectric Resonator", pp. 175–180, *12th European Microwave Conference* 82.

Primary Examiner—Eugene R. LaRoche
Assistant Examiner—David Mis
Attorney, Agent, or Firm—Sughrue, Mion, Zinn, Macpeak & Seas

[57] ABSTRACT

In a dielectric resonator controlled oscillator with frequency multiplication, a line (12) has an open end and another end connected to a gate electrode of an FET (11) with a dielectric resonator (13) electromagnetically coupled to the line at a location along a total length of the line. The total length is selected to make a combination of the line and the dielectric resonator have a substantially zero impedance for a higher harmonic frequency when seen from the gate electrode. More specifically, the total length is selected so as to be equal to about three quarters of a wavelength which a frequency multiplied oscillation, such as a frequency doubled oscillation, has in the line. The location is selected so as to optimize the oscillator for a fundamental oscillation of a fundamental frequency determined by the dielectric resonator.

3 Claims, 2 Drawing Sheets

DIELECTRIC RESONATOR CONTROLLED OSCILLATOR HAVING A RAISED FREQUENCY MULTIPLYING EFFICIENCY

BACKGROUND OF THE INVENTION

This invention relates to a dielectric resonator controlled or stabilized oscillator with frequency multiplication.

Dielectric resonator controlled oscillators are described in a tutorial review which was contributed by James K. Ploudre et al to IEEE Transactions on Microwave Theory and Techniques, Volume MTT-29, No. 8 (August 1981), pages 754 to 770, under the title of "Application of Dielectric Resonators in Microwave Components". According to the Ploudre et al review, page 763, the dielectric resonator controlled oscillators are advantageous of small size, simple structure, low cost, insensitivity to mechanical vibration and electric power transients, tone-free output, low noise, or direct operation between 1 GHz and 12 GHz even without frequency multiplication.

In the manner which will later be described more in detail, a conventional dielectric resonator controlled oscillator with frequency multiplication comprises a field effect transistor (FET) having a gate electrode, a source electrode, and a drain electrode and a gate-side circuit which comprises a transmission line or microstrip line having a first end terminated by a resistor and a second end connected to the gate electrode and a dielectric resonator electromagnetically coupled to the line so that the gate-side circuit be tuned to a fundamental oscillation generated by the oscillator. Between the gate and the source electrodes, the field effect transistor has a nonlinear diode characteristic which multiplies the fundamental oscillation in frequency into a higher harmonic or frequency multiplied oscillation. With the conventional dielectric resonator controlled oscillator, a loss has been inevitably caused to the higher harmonic oscillation. The conventional dielectric resonator controlled oscillator therefore has a low oscillation efficiency for the higher harmonic oscillation.

As will also be described later, an improved conventional dielectric resonator controlled oscillator is disclosed in European Patent Application No. 83 103 122.4 which was filed by Nippon Electric Co., Ltd., namely, NEC Corporation, assignee from Mizumura, Motoo et al, the inventors, and was published 05.10.83 under Publication No. 0 090 414. In the improved conventional oscillator, the above-mentioned first end is an open end. It has now been found that the improved conventional oscillator has an electric characteristic which has a room for further improvement.

SUMMARY OF THE INVENTION

It is therefore an object of the present invention to provide a dielectric resonator controlled oscillator with frequency multiplication, which gives a low loss to a higher harmonic oscillation.

It is another object of this invention to provide a dielectric resonator controlled oscillator of the type described, which has a high efficiency of generating the higher harmonic oscillation, namely, a raised frequency multiplying efficiency.

Other objects of this invention will become clear as the description proceeds.

According to this invention, there is provided a dielectric resonator controlled oscillator with frequency multiplication comprising a field effect transistor having a gate electrode and a gate-side circuit which comprises a line having a predetermined total length, an open end, and another end connected to said gate electrode and a dielectric resonator electromagnetically coupled to said line at a location along said total length, said oscillator generating a higher harmonic oscillation with a highest possible efficiency, said higher harmonic oscillation having a higher harmonic frequency of a fundamental frequency determined by said dielectric resonator, the improvement wherein said total length is selected so that said gate-side circuit has a substantially zero impedance at and near said higher harmonic frequency when seen from said gate electrode.

DESCRIPTION OF THE PREFERRED EMBODIMENT

Figure 1:
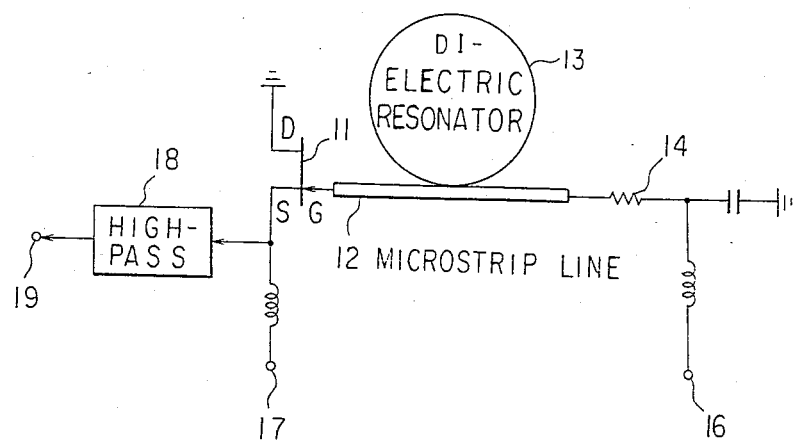
FIG. 1 schematically shows a conventional dielectric resonator controlled oscillator with frequency multiplication.

Referring to FIG. 1, a conventional dielectric resonator controlled or stabilized oscillator with frequency multiplication will be described at first in order to facilitate an understanding of the present invention. The oscillator comprises a field effect transistor (FET) 11 having a gate electrode G, a source electrode S, and a drain electrode D which is grounded. A gate-side circuit comprises a microstrip line 12 having a first and a second end and a dielectric resonator 13 which is electromagnetically coupled to the line 12 at a location. The dielectric resonator 13 has a resonant frequency which determines a fundamental frequency of a fundamental oscillation generated by the oscillator.

The first end of the line 12 is terminated by a resistor 14 of an impedance which is equal to a characteristic impedance of the line 12. The second end is connected to the gate electrode G of the field effect transistor 11. A gate bias voltage is supplied through a gate bias terminal 16, the resistor 14, and the line 12 to the gate electrode G. The gate bias terminal 16 is grounded through a high-pass filter. A source bias voltage is supplied through a source bias terminal 17 and a choke coil to the source electrode S.

The field effect transistor 11 has a nonlinear diode characteristic between the gate and the source electrodes G and S. The nonlinear diode characteristic serves to frequency multiply the fundamental oscillation into a higher harmonic or frequency multiplied oscillation which is typically a frequency doubled oscillation. A high-pass filter 18 is interposed between the source electrode S and an output terminal 19. The high-pass filter 18 reflects the fundamental oscillation back to the source electrode S and allows the higher harmonic oscillation to pass to the output terminal 19.

When seen from the gate electrode G, the gate-side circuit has a reflection coefficient of an absolute value which is approximately equal to unity at and near the resonant frequency of the dielectric resonator 13 and therefore at and near the fundamental frequency. At other frequencies, the gate-side circuit is match-terminated. The oscillator is therefore of a band-reflection type.

In the manner described above, the gate terminal G is match-terminated for the higher harmonic oscillation which is obtained at the output terminal 19. A loss is consequently unavoidable to the higher harmonic oscillation. In other words, the oscillator has a low oscillation efficiency for the higher harmonic oscillation. By way of a numerical example, the conventional oscillator has a higher harmonic output of about 15 dBm at 18 GHz when the field effect transistor 11 was of the type NE900275M manufactured and sold by NEC Corporation and when the fundamental frequency was 9 GHz.

Figure 2:
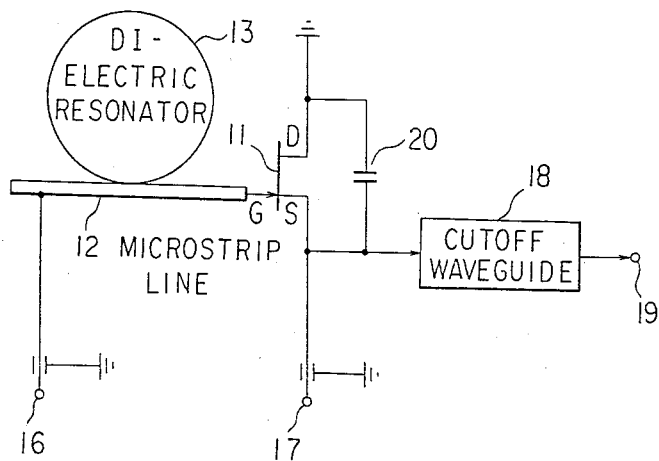
FIG. 2 shows an equivalent circuit of another conventional dielectric resonator controlled oscillator with frequency multiplication.

Turning to FIG. 2, an improved conventional dielectric resonator controlled oscillator with frequency multiplication has a structure revealed in the above-referenced European Patent Application. The improved conventional oscillator comprises similar parts which are designated by like reference numerals.

It should be noted that the line 12 has an open end as the above-described first end. The second end is connected to the gate electrode G as above. The high-pass filter 18 is implemented by a waveguide which has a cutoff size for the fundamental oscillation of the oscillator. The cutoff size is indicated in the European Patent Application by a reference letter l. Incidentally, a feedback capacitor 20 is used between the source and the drain electrodes S and D.

According to the European Patent Application, the improved conventional oscillator has a simple structure and a stable electric characteristic. Despite these advantages, it has now been found possible to further improve the electric characteristic in the manner which will become clear in the following.

Figure 3:
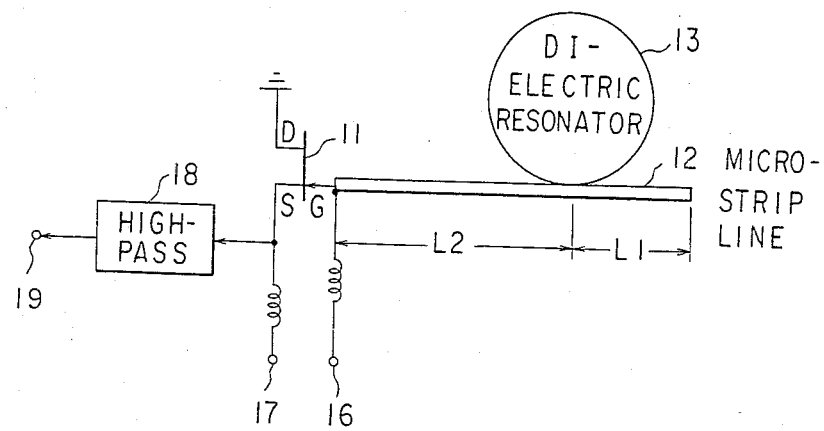
FIG. 3 schematically shows a dielectric resonator controlled oscillator with frequency multiplication according to an embodiment of the instant invention.
Figure 4:
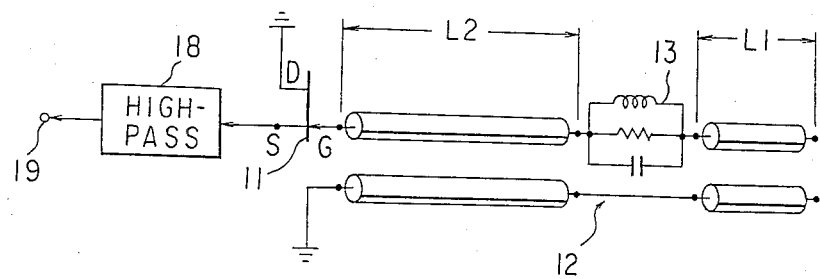
FIG. 4 shows an equivalent circuit of the oscillator illustrated in FIG. 3.

Referring now to FIGS. 3 and 4, a dielectric resonator controlled or stabilized oscillator with frequency multiplication comprises similar parts designated by like reference numerals according to a preferred embodiment of this invention. Like the improved conventional oscillator illustrated with reference to FIG. 2, the line 12 has an open end and another end connected to the gate electrode G of the field effect transistor 11. In the example being illustrated, the line 12 is a microstrip line. Being different from the improved conventional oscillator, the gate bias voltage is supplied to the gate electrode G not through the line 12 but merely through the gate bias terminal 16 and a choke coil.

The location at which the dielectric resonator 13 is electromagnetically coupled to the line 12, will be indicated by a first length L1 from the open end of the line 12 and a second length L2 from the other end connected to the gate electrode G. That is, the line 12 has a total length which is equal to a sum of the first and the second lengths L1 and L2. The dielectric resonator 13 is therefore electromagnetically coupled to the line 12 at a location which is selected along the total length.

When seen from the gate electrode G, the gate or gate-side circuit has an impedance which is determined at and near the fundamental frequency by the Q factor of the dielectric resonator 13, the second length L2, and the characteristic impedance of the line 12. At other frequencies, the impedance of the gate-side circuit is determined by the total length and the characteristic impedance. The second length L2 is selected so as to optimize the characteristic which the oscillator has for the fundamental oscillation.

It is now understood from the above that the gate-side circuit is different from that of the improved conventional oscillator in that the gate-side circuit of FIGS. 3 and 4 is not match-terminated but has a substantially zero impedance for a desired higher harmonic frequency when seen from the gate electrode G. In other words, the gate electrode G is short-circuited by the gate-side circuit for the higher harmonic oscillation.

More particularly, the line 12 is given the total length which is substantially equal to three quarters of the wavelength of the higher harmonic oscillation in the line 12. It should be noted in this connection that the total length need not be exactly equal to three quarters of the wavelength under consideration. Instead, various factors contribute to the total length which makes the oscillator generate the higher harmonic oscillation with a highest possible efficiency. It is therefore convenient to empirically select the total length near three quarters of the wavelength in question.

When the total length and the location are optimally selected in this manner, the gate electrode G is driven or excited by the fundamental oscillation. A current is produced at the higher harmonic frequency by the non-linear gate-source diode characteristic and is driven to its fullest intensity. A strong higher harmonic output is obtained from the source electrode S through the high-pass filter 18 at the output terminal 19. This makes it possible to achieve a raised frequency multiplying efficiency.

In fact, a strong frequency multiplied output of 19 dBm was obtained at 18 GHz by a dielectric resonator controlled oscillator which was of the structure depicted in FIG. 3 and was for generating the fundamental oscillation at 9 GHz. The field effect transistor 11 was of the aforementioned type of NE900275M. The drain-source bias voltage $V_{DS}$ was 5 volts. The drain-source bias current $I_{DS}$ was 140 mA. The output efficiency was 11.3% and was more than twice the efficiency attained by the numerical example described before.

While this invention has thus far been described in specific conjunction with a single preferred embodiment thereof, it will now be readily possible for one skilled in the art to carry this invention into effect in various other manners. For example, the total length may be longer than three quarters of the wavelength in question by an integral multiple of the wavelength.

What is claimed is:

1. In a dielectric resonator controlled oscillator with frequency multiplication comprising a field effect transistor having a gate electrode and a gate-side circuit which comprises a line having a predetermined total length, an open end, and another end connected to said gate electrode and a dielectric resonator electromagnetically coupled to said line at a location along said total length, said oscillator generating a higher harmonic oscillation with a highest possible efficiency, said higher harmonic oscillation having a higher harmonic frequency of a fundamental frequency determined by said dielectric resonator, the improvement wherein said total length is selected so that said gate-side circuit has a substantially zero impedance at and near said higher harmonic frequency when seen from said gate electrode.

2. A dielectric resonator controlled oscillator as claimed in claim 1, said field effect transistor having a source electrode connected to a high-pass filter for said higher harmonic oscillation, wherein said total length is selected so as to be substantially equal to three quarters of a wavelength which said higher harmonic oscillation has in said line, said location being selected so as to optimize said oscillator for an oscillation of said fundamental frequency.

3. A dielectric resonator controlled oscillator as claimed in claim 1, wherein said total length is selected so as to be substantially equal to three quarters of a wavelength which a frequency doubled oscillation has in said line.

* * * * *

UNITED STATES PATENT AND TRADEMARK OFFICE
CERTIFICATE OF CORRECTION

PATENT NO. : 4,736,168

DATED : April 5, 1988

INVENTOR(S) : Nagata

It is certified that error appears in the above-identified patent and that said Letters Patent is hereby corrected as shown below:

COLUMN 3, LINE 30  Delete "1" and insert --$\underline{1}$--.

Signed and Sealed this

Twenty-eighth Day of February, 1989

Attest:

DONALD J. QUIGG

*Attesting Officer*  *Commissioner of Patents and Trademarks*